(12) United States Patent
Engqvist et al.

(10) Patent No.: US 11,213,893 B2
(45) Date of Patent: Jan. 4, 2022

(54) CVD COATED CUTTING TOOL

(71) Applicant: SANDVIK INTELLECTUAL PROPERTY AB, Sandviken (SE)

(72) Inventors: Jan Engqvist, Uppsala (SE); Erik Lindahl, Knivsta (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 453 days.

(21) Appl. No.: 16/310,937

(22) PCT Filed: Jun. 20, 2017

(86) PCT No.: PCT/EP2017/064999
§ 371 (c)(1),
(2) Date: Dec. 18, 2018

(87) PCT Pub. No.: WO2018/001786
PCT Pub. Date: Jan. 4, 2018

(65) Prior Publication Data
US 2020/0306837 A1    Oct. 1, 2020

(30) Foreign Application Priority Data

Jun. 29, 2016   (EP) .................................. 16176939

(51) Int. Cl.
*B32B 27/14* (2006.01)
*B23B 27/14* (2006.01)
(Continued)

(52) U.S. Cl.
CPC ............ *B23B 27/148* (2013.01); *C23C 16/34* (2013.01); *C23C 16/36* (2013.01); *C23C 16/403* (2013.01); *B23B 2228/10* (2013.01)

(58) Field of Classification Search
CPC ...... B23B 27/14; B23B 27/148; B23B 228/10; B23B 228/105; C23C 16/34; C23C 16/36; C23C 16/403
(Continued)

(56) References Cited

U.S. PATENT DOCUMENTS 6,250,855 B1 * 6/2001 Persson .................. C22C 29/08
407/119
7,232,603 B2 * 6/2007 Hessman ............... C23C 16/30
428/702

(Continued)

FOREIGN PATENT DOCUMENTS

EA        010934 B1    12/2008
EP      2902528 A1     8/2015
(Continued)

OTHER PUBLICATIONS

Souza et al. "Standard transition aluminas. Electron microscopy studies", Materials Research-Ibero-American Journal of Materials, vo. 3, No. 4, Oct. 2000, pp. 104-114.

*Primary Examiner* — Archene A Turner
(74) *Attorney, Agent, or Firm* — Corinne R. Gorski

(57) ABSTRACT

A coated cutting tool includes a substrate and a coating of one of more layers. The coating includes a layer of $\alpha\text{-}Al_2O_3$ of a thickness of 1-20 μm deposited by chemical vapour deposition (CVD). The $\alpha\text{-}Al_2O_3$ layer exhibits an X-ray diffraction pattern and wherein the texture coefficient TC(h k 1) is defined according to the Harris formula, wherein $1<TC(0\ 2\ 4)<4$ and $3<TC(0\ 0\ 12)<6$.

15 Claims, 5 Drawing Sheets

(51) Int. Cl.
*C23C 16/34* (2006.01)
*C23C 16/36* (2006.01)
*C23C 16/40* (2006.01)

(58) Field of Classification Search
USPC ......... 407/119; 428/325, 336, 698, 701, 702
See application file for complete search history.

(56) References Cited

U.S. PATENT DOCUMENTS

| | | | |
|---|---|---|---|
| RE41,972 E * | 11/2010 | Lenander | C23C 16/403 |
| | | | 428/336 |
| 8,828,527 B2 * | 9/2014 | Tomita | C23C 28/042 |
| | | | 428/336 |
| 2005/0129987 A1 * | 6/2005 | Ruppi | C23C 28/044 |
| | | | 428/698 |
| 2006/0204757 A1 * | 9/2006 | Ljungberg | C23C 16/30 |
| | | | 428/408 |
| 2007/0009763 A1 * | 1/2007 | Littecke | C23C 16/56 |
| | | | 428/701 |
| 2007/0104945 A1 | 5/2007 | Ruppi | |
| 2014/0193624 A1 * | 7/2014 | Stiens | C23C 16/403 |
| | | | 428/216 |
| 2016/0136786 A1 * | 5/2016 | Bjormander | C23C 30/005 |
| | | | 51/309 |
| 2017/0008092 A1 * | 1/2017 | Ruppi | C30B 29/20 |

FOREIGN PATENT DOCUMENTS

| | | |
|---|---|---|
| EP | 3034652 A1 | 6/2016 |
| RU | 2131329 C1 | 6/1999 |
| RU | 2131330 C1 | 6/1999 |
| RU | 2206432 C2 | 6/2003 |
| WO | 201419881 A1 | 12/2014 |

* cited by examiner

CVD COATED CUTTING TOOL

RELATED APPLICATION DATA

This application is a § 371 National Stage Application of PCT International Application No. PCT/EP2017/064999 filed Jun. 20, 2017 claiming priority to EP 16176939.3 filed Jun. 29, 2016.

TECHNICAL FIELD

The present invention relates to a CVD coated cutting tool comprising a substrate and a coating, wherein the coating comprises at least one $\alpha\text{-}Al_2O_3$ layer.

BACKGROUND ART

In the technical area of cutting tools for metal machining, the usage of CVD coatings is a well-known method to enhance the wear resistance of the tool. CVD coatings that are commonly used are ceramic coatings such as TiN, TiC, TiCN and $Al_2O_3$.

The knowledge of the wear resistance of $Al_2O_3$ coatings has increased during the years and properties of different $Al_2O_3$ coatings have been studied in detail in several disclosures.

US 2007/0104945A1 discloses a cutting tool comprising an $\alpha\text{-}Al_2O_3$ coating showing a strong texture along <0 0 1>.

OBJECT OF THE INVENTION

It is an object of the present invention to provide a coated cutting tool having an $\alpha\text{-}Al_2O_3$ layer that exhibits improved cutting properties in turning, milling and/or drilling. It is a further object to provide a cutting tool with improved crater wear resistance in combination with improved resistance against flaking at plastic deformation of the cutting edge.

SUMMARY OF THE INVENTION

The present invention relates to a coated cutting tool comprising a substrate and a coating, wherein said coating comprises one of more layers and wherein the coating comprises at least one layer of $\alpha\text{-}Al_2O_3$ of a thickness of 1-20 µm deposited by chemical vapour deposition (CVD), wherein said $\alpha\text{-}Al_2O_3$ layer exhibits an X-ray diffraction (XRD) pattern, as measured using CuKα radiation and theta-2theta scan, wherein the texture coefficient TC(hkl) is defined according to Harris formula $$TC(hkl) = \frac{I(hkl)}{I0(hkl)} \left[ \frac{1}{n} \sum_{i=0}^{n} \frac{I(hkl)}{I0(hkl)} \right]^{-1} \quad (1)$$

wherein the (h k l) reflections used are (1 0 4), (1 1 0), (1 1 3), (0 2 4), (1 1 6), (2 1 4), (3 0 0) and (0 0 12), I(h k l)=measured intensity (integrated peak area) of the (h k l) reflection $I_0$(h k l)=standard intensity according to ICDD's PDF-card No. 00-10-0173, n=number of reflections used in the calculation (in this case 8 reflections), and wherein 1<TC(0 2 4)<4 and 3<TC(0 0 12)<6.

The substrate is made of cemented carbide, cermet, ceramic or a super hard material such as cBN.

The $\alpha\text{-}Al_2O_3$ layer is typically deposited by thermal CVD. Alternatively other CVD deposition processes can be used. This is also the case for any further layers of the coating as disclosed below.

The $\alpha\text{-}Al_2O_3$ layer comprises crystalline grains, and hereinafter grains of the $\alpha\text{-}Al_2O_3$ layer comprising (0 0 1) planes in parallel with the substrate surface will be referred to as (0 0 1) oriented grains. In the corresponding way grains of the $\alpha\text{-}Al_2O_3$ layer comprising (0 1 2) planes in parallel with the substrate surface will be referred to as (0 1 2) oriented grains.

The coated cutting tool of the present invention comprises a new and improved $\alpha\text{-}Al_2O_3$ layer where the layer comprises a mixture of (0 0 1) oriented grains and (0 1 2) oriented grains. The layer has surprisingly shown to provide improved cutting performance by a combination of both high crater wear resistance and resistance against flaking due to plastic deformation of the cutting edge. This combination of wear resistance properties has shown to be very useful for cutting tools used in for example heavy turning operations, such as tough turning of steel. Plastic deformation of the cutting edge can occur if the heat that is generated during cutting is high enough to weaken the binder phase in the cemented carbide so that the cutting edge deforms by the load on the cutting edge during cutting. A deformation of the cutting edge is very demanding for the coating, since the coating is a ceramic and not very ductile. The coating will then typically crack and thereafter flake off from the substrate. The $\alpha\text{-}Al_2O_3$ layer of the present invention provides more resistance against this wear mechanism in combination with a retained high resistance against crater wear.

The $\alpha\text{-}Al_2O_3$ layer of the present invention comprises a specific combination of (0 0 1) oriented grains and (0 1 2) oriented grains. An interpretation is that the (0 0 1) oriented grains contribute to a high crater wear resistance and the (0 1 2) oriented grains contribute with a high resistance against coating cracking and flaking at plastic deformation of the cutting edges.

A means to express preferred texture is to calculate a texture coefficient TC (h k l) calculated using the Harris formula (formula (1) above) on the basis of a defined set of XRD reflections measured on the respective sample. The intensities of the XRD reflections are standardized using a JCPDF-card indicating the intensities of the XRD reflections of the same material, i.e. $\alpha\text{-}Al_2O_3$, but with random orientation, such as in a powder of the material. A texture coefficient TC (h k l)>1 of a layer of crystalline material is an indication that the grains of the crystalline material are oriented with their (h k l) crystallographic plane parallel to the substrate surface more frequently than in a random distribution. The texture coefficient TC (0 0 12) is used herein to indicate preferred crystal growth with the (0 0 1) plane in parallel to the substrate surface. The (0 0 1) crystallographic plane is parallel to the (0 0 6) and (0 0 12) crystallographic planes in the $\alpha\text{-}Al_2O_3$ crystallographic system. In a corresponding way the (0 1 2) crystallographic plane is parallel to the (0 2 4) crystallographic plane in the $\alpha\text{-}Al_2O_3$ crystallographic system.

In one embodiment of the present invention said $\alpha\text{-}Al_2O_3$ layer exhibits 1<TC(0 2 4)<3 and 3.5<TC(0 0 12)<5.5. In one embodiment said $\alpha\text{-}Al_2O_3$ layer exhibits 1.5<TC(0 2 4)<2.5 and 4<TC(0 0 12)<5.

In one embodiment of the present invention the third strongest TC(h k l) of said $\alpha\text{-}A_2O_3$ layer is TC(1 1 0). In one embodiment of the present invention the sum of the TC(0 0 12) and TC(0 2 4) for said $\alpha\text{-}Al_2O_3$ layer is 6.5.

In one embodiment of the present invention the $\alpha\text{-}Al_2O_3$ layer exhibits a {0 0 1} pole figure as measured by EBSD in a portion of the $\alpha\text{-}Al_2O_3$ layer parallel to the outer surface of the coating, wherein a pole plot based on the data of the pole figure, with a bin size of 0.25° over a tilt angle range of $0° \leq \beta23\ 90°$ from the normal of the outer surface of the coating shows a ratio of intensity within β23 15° tilt angle to the intensity within $0° \leq \beta \leq 90°$ of 40%, preferably 50%, more preferably 60% and 80%, and said α-$Al_2O_3$ layer exhibits a {0 1 2} pole figure as measured by EBSD in a portion of the α-$Al_2O_3$ layer parallel to the outer surface of the coating, wherein a pole plot based on the data of the pole figure, with a bin size of 0.25° over a tilt angle range of $0° \leq \beta \leq 90°$ from the normal of the outer surface of the coating shows a ratio of intensity within β≤15° tilt angle to the intensity within $0° \leq \beta \leq 90°$ of ≤40%, preferably ≤50%, or ≤40% and ≤60%. The {0 0 1} pole figure and the {0 1 2} pole figure are preferably from the same portion of the α-$Al_2O_3$ layer. The portion of the α-$Al_2O_3$ layer is preferably located ≥1 μm from the innermost portion of the α-$Al_2O_3$ layer. The innermost portion of the α-$Al_2O_3$ layer is typically the interface between the bonding layer and the α-$Al_2O_3$ layer.

In one embodiment of the present invention the α-$Al_2O_3$ layer comprises columnar grains, the α-$Al_2O_3$ layer is preferably a columnar layer. Preferably the α-$Al_2O_3$ layer comprises columnar grains of {0 0 1} and {0 1 2} orientation, respectively, existing throughout the total thickness of the α-$Al_2O_3$ layer.

In one embodiment of the present invention the α-$Al_2O_3$ layer comprises columnar α-$Al_2O_3$ layer grains and wherein the average width of said columnar grains is 0.5-2 μm as measured along a line parallel to the surface of the substrate in the middle of said α-$Al_2O_3$ layer.

In one embodiment of the present invention the average thickness of the α-$Al_2O_3$ layer is 2-10 μm or 3-7 m.

In one embodiment of the present invention the coating further comprises a layer of one or more of TiN, TiCN, TiC, TiCO, TiCNO.

In one embodiment of the present invention the coating comprises layers in the following order from the surface of the substrate TiN, TiCN, TiCNO and α-$Al_2O_3$.

In one embodiment of the present invention the coating comprises an outermost wear indication color layer, for example TiN.

In one embodiment of the present invention the substrate consists of cemented carbide with a surface zone from the substrate surface and to a depth of about 15-35 μm into the body, wherein said surface zone being binder phase enriched and essentially free from cubic carbides. This surface zone, or so called gradient zone, is advantageous in that it provides toughness to the cutting edge which prevents the cutting edge from breakage. The combination of the layer of the invention with this gradient zone is advantageous since the gradient zone increases the risk for flaking due to plastic deformation of the cutting edge and an advantage with the layer is that it can resist flaking at plastic deformation of the cutting edge.

In one embodiment of the present invention the substrate consists of cemented carbide with a Co content of 6-12 wt %, preferably 8-11 wt %. These Co contents can be considered to be relatively high, and these higher levels imply an increased risk of flaking due to plastic deformation of the cutting edge. Since the layer of the present invention can withstand some plastic deformation without flaking, it is possible to combine with higher Co contents.

In one embodiment of the present invention the cutting tool is a cutting insert and where an inscribed circle of said cutting insert has a diameter of ≥15 mm. An inscribed circle is the largest possible circle that can be drawn interior to a plane figure, in this case for example the figure can be an insert as seen from its rake face. For these relatively large inserts the resistance against flaking due to plastic deformation of the cutting edge is even more important, and the layer of the present invention can provide the resistance needed in combination with a high crater wear resistance.

Still other objects and features of the present invention will become apparent from the following detailed description considered in conjunction with the accompanying drawings.

METHODS

XRD examination

In order to investigate the texture of the layer(s) X-ray diffraction was conducted on the flank face using a PANalytical CubiX3 diffractometer equipped with a PIXcel detector. The coated cutting tools were mounted in sample holders to ensure that the flank face of the samples are parallel to the reference surface of the sample holder and also that the flank face is at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu-Kα2 stripping and profile fitting of the data, was done using PANalytical's X'Pert HighScore Plus software. The output (integrated peak areas for the profile fitted curve) from this program were then used to calculate the texture coefficients of the layer by comparing the ratio of the measured intensity data to the standard intensity data according to a PDF-card of the specific layer (such as a layer of α-$Al_2O_3$), using the Harris formula (1) as disclosed above. Since the layer was a finitely thick film the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-$Al_2O_3$ layer will affect the X-ray intensities entering the α-$Al_2O_3$ layer and exiting the whole coating, corrections need to be made for these as well, taken into account the linear absorption coefficient for the respective compound in a layer. Alternatively, a further layer, such as TiN, above an alumina layer can be removed by a method that does not substantially influence the XRD measurement results, e.g. chemical etching.

In order to investigate the texture of the α-$Al_2O_3$ layer X-ray diffraction was conducted using CuKα radiation and texture coefficients TC (hkl) for different growth directions of the columnar grains of the α-$Al_2O_3$ layer were calculated according to Harris formula (1) as disclosed above, where I(hkl)=measured (integrated area) intensity of the (hkl) reflection, IO(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12). The measured integrated peak area is thin film corrected and also corrected for any further layers above (i.e. on top of) the α-$Al_2O_3$ layer before said ratio is calculated.

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the α-Al$_2$O$_3$ layer with peaks from the TiCN layer might influence measurement and needs to be considered. It is also to be noted that for example WC in the substrate can have diffraction peaks close to the relevant peaks of the present invention.

EBSD Examination

Pole plots provided by EBSD (electron backscatter diffraction) were studied as described herein. The EBSD technique is based on automatic analysis of Kikuchi-type diffraction patterns generated by backscattered electrons.

Surfaces of the coated inserts were prepared for electron backscatter diffraction (EBSD) characterization by polishing the coating surface using a Gatan Inc. Dimple Grinder model 656 with a 20 mm felt wheel, applying 20 grams of weight and using Buehlers polishing suspension named "Master Polish 2". The polishing was performed just until sufficiently large and smooth surfaces of the α-Al$_2$O$_3$ layer were acquired. The surfaces were immediately cleaned to remove residual polishing suspension and dried with a clean air spray.

The prepared samples were mounted on to a sample holder and inserted into the scanning electron microscope (SEM). The samples were tilted 70° with respect to the horizontal plane and towards the EBSD detector. The SEM used for the characterization was a Zeiss Supra 55 VP operated at 15 kV, using a 60 μm objective aperture, applying "High current" mode and operated in variable pressure (VP) mode at a SEM chamber pressure of 0.128 Torr. The used EBSD detector was an Oxford Instruments Nordlys-Max Detector operated using Oxford Instruments "AZtec" software version 3.1. EBSD data acquisitions were made by applying a focused electron beam on to the polished surfaces and sequentially acquiring EBSD data using a step size of 0.05 μm for 500×300 (X×Y) measuring points. The reference phase used by the "AZtec" software for the data acquisition was: "Electrochem. Soc. [JESOAN], (1950), vol. 97, pages 299-304" and is referred to as "Ti2 C N" in the "AZtec" software.

EXAMPLES

Figure 1:
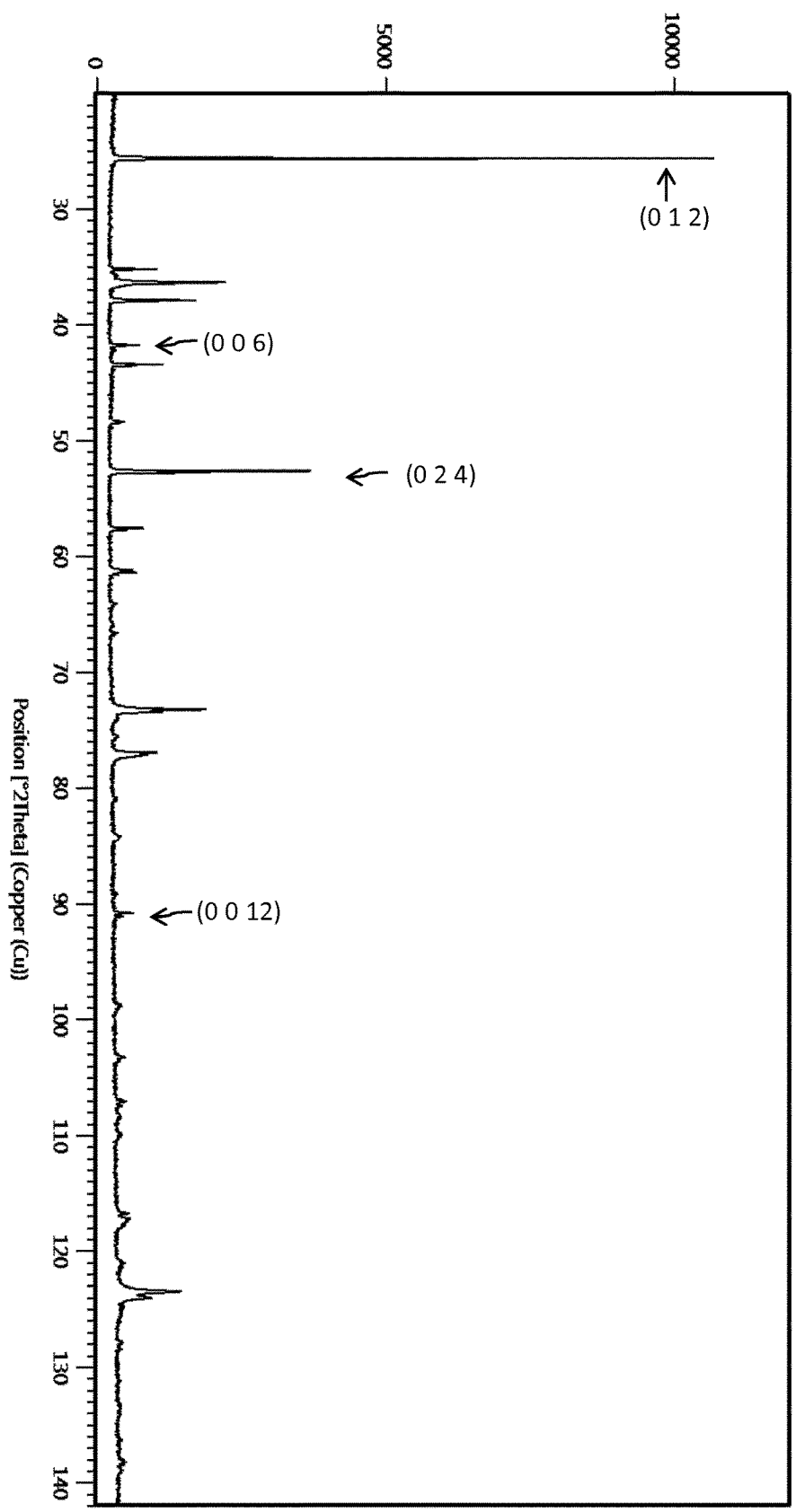
FIG. 1. XRD diffraction graph of Sample 1. The graph is based on raw data and no corrections have been applied. The (0 0 6) peak and the (0 0 12) peak of the α-A$_2$O$_3$ layer are visible at about 41.7° and 90.7°, respectively. The (0 1 2) peak and the (0 2 4) peak are visible at about 25.6° and 52.6°, respectively.
Figure 2:
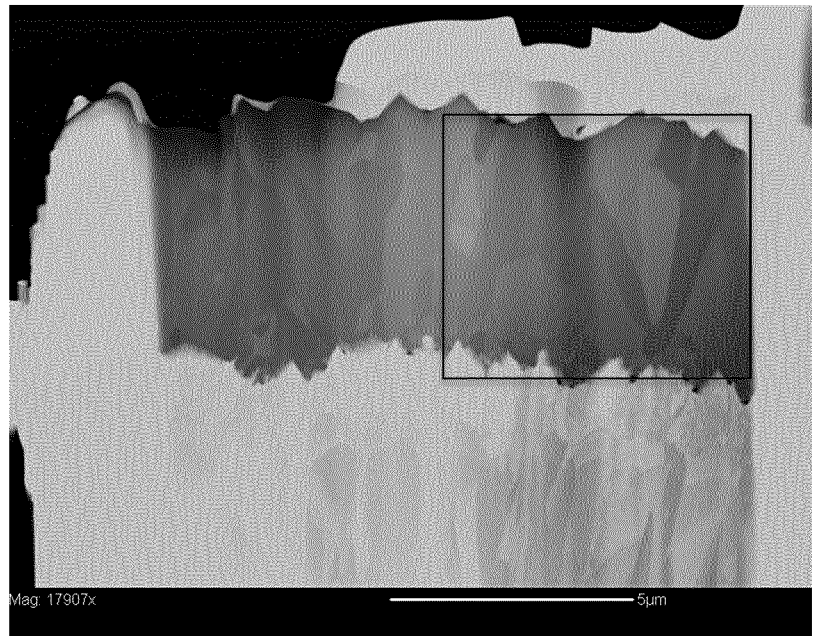
FIG. 2. SEM image of a cross section of the α-Al$_2$O$_3$ layer of Sample 1.
Figure 3:
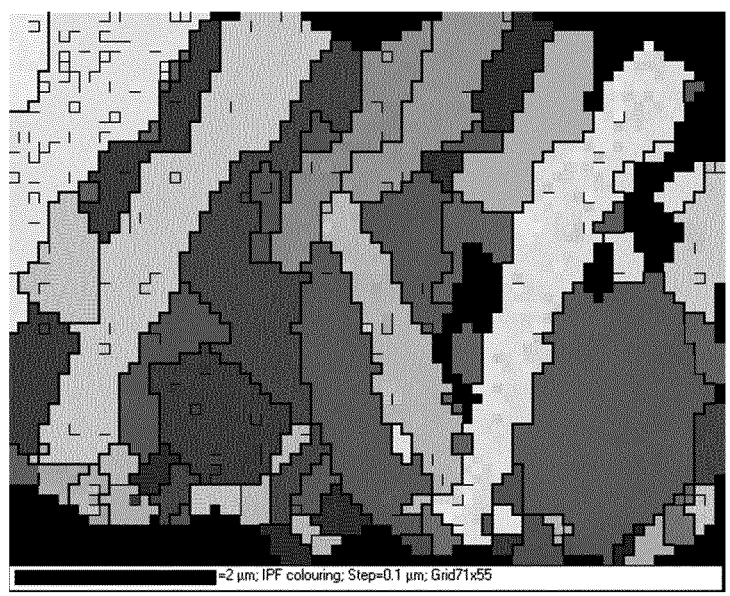
FIG. 3. EBSD image of the area of the α-Al$_2$O$_3$ layer of Sample 1 as indicated with a black box in FIG. 2.
Figure 4:
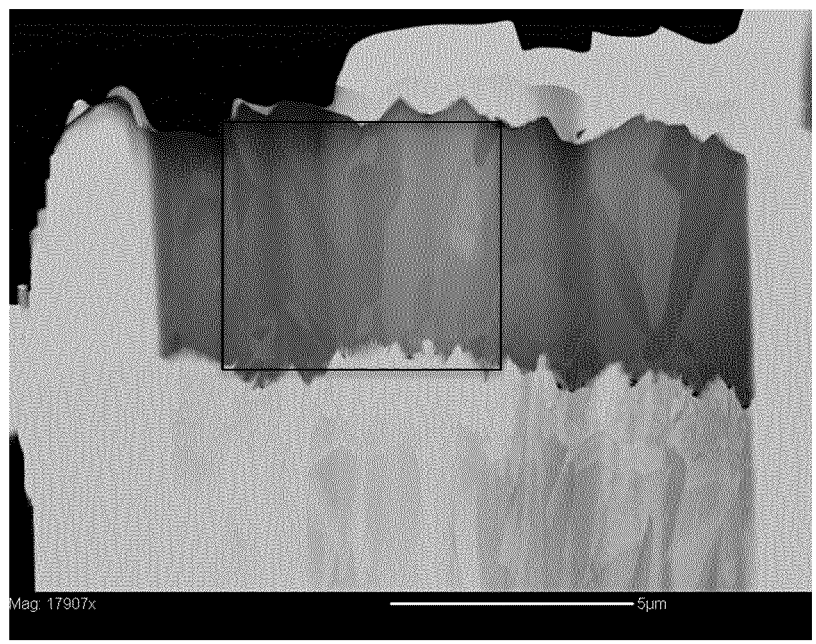
FIG. 4. SEM image of a cross section of the α-Al$_2$O$_3$ layer of Sample 1.
Figure 5:
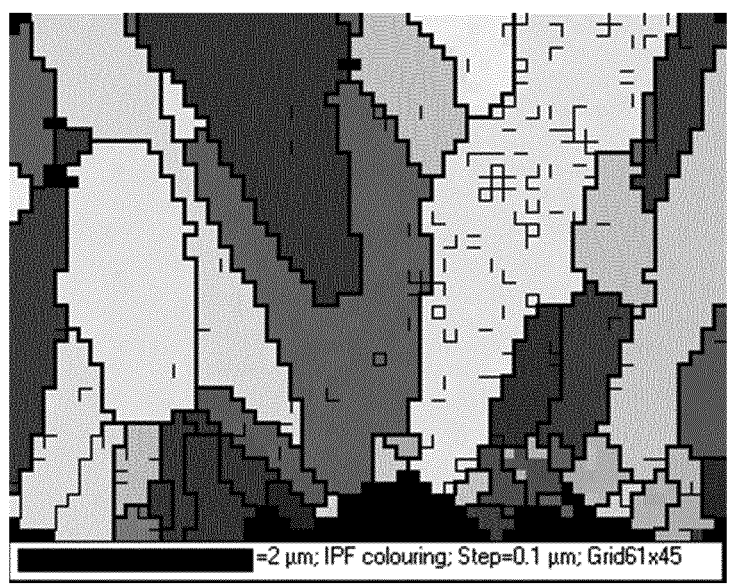
FIG. 5. EBSD image of the area of the α-Al$_2$O$_3$ layer of Sample 1 as indicated with a black box in FIG. 4.

Embodiments of the present invention will be disclosed in more detail in connection with the following examples. The examples are to be considered as illustrative and not limiting embodiments. In the following examples coated cutting tools (inserts) were manufactured, analyzed and evaluated in cutting tests.

Example 1

Sample Preparation

Sample 1 (invention)

Cemented carbide substrates of ISO-type CNMG120408 for turning were manufactured from 7.2 wt-% Co, 2.7 wt % Ta, 1.8 wt % Ti, 0.4 wt % Nb, 0.1 wt % N and balance WC, comprising a Co enriched surface zone of about 25 μm from the substrate surface and to a depth into the body being essentially free from cubic carbides. The composition of the cemented carbide is thus about 7.2 wt % Co, 2.9 wt % TaC, 1.9 wt % TiC, 0.4 wt % TiN, 0.4 wt % NbC and 86.9 wt % WC.

The substrates were first coated with a thin approximately 0.4 μm TiN-layer then with an approximately 7 μm TiCN layer by employing the well-known MTCVD technique using TiCl$_4$, CH$_3$CN, N$_2$, HCl and H$_2$ at 885° C. The volume ratio of TiCl$_4$/CH$_3$CN in an initial part of the MTCVD deposition of the TiCN layer was 6.6, followed by a period using a ratio of TiCl$_4$/CH$_3$CN of 3.7.

On top of the MTCVD TiCN layer was a 1-2 μm thick bonding layer deposited at 1000° C. by a process consisting of four separate reaction steps. First a HTCVD TiCN step using TiCl$_4$, CH$_4$, N$_2$, HCl and H$_2$ at 400 mbar, then a second step (TiCNO-1) using TiCl$_4$, CH$_3$CN, CO, N$_2$, HCl and H$_2$ at 70 mbar, then a third step (TiCNO-2) using TiCl$_4$, CH$_3$CN, CO, N$_2$ and H$_2$ at 70 mbar and finally a fourth step (TiCNO-3) using TiCl$_4$, CO, N$_2$ and H$_2$ at 70 mbar. Prior to the start of the subsequent Al$_2$O$_3$ nucleation, the bonding layer was oxidized for 4 minutes in a mixture of CO$_2$, CO, N$_2$ and H2.

On top of the bonding layer an α-Al$_2$O$_3$ layer was deposited at 1000° C. and 55 mbar in two steps. The first step using 1.2 vol-% AlCl$_3$, 4.7 vol-% CO$_2$, 1.8 vol-% HCl and balance H$_2$ giving about 0.1 μm α-Al$_2$O$_3$ and a second step using 2.2 vol-% AlCl$_3$, 4.4 vol-% CO$_2$, 5.5 vol-% HCl, 0.33 vol-% H$_2$5 and balance H$_2$ giving a total α-Al$_2$O$_3$ layer thickness of about 4 μm.

Sample 2 (Reference)

Cemented carbide substrates of ISO-type CNMG120408 for turning were manufactured from: 7.5 wt-% Co, 2.7 wt % Ta, 1.8 wt % Ti, 0.4 wt % Nb, 0.1 wt % N and balance WC. The substrates comprise a Co enriched surface zone of about 25 μm from the substrate surface and to a depth into the body being essentially free from cubic carbides.

The substrates were first coated with a thin approximately 0.4 μm TiN-layer then with an approximately 7 μm TiCN layer by employing the well-known MTCVD technique using TiCl$_4$, CH$_3$CN, N$_2$, HCl and H$_2$ at 885° C. The volume ratio of TiCl$_4$/CH$_3$CN of the MTCVD deposition of the TiCN layer was 2.2.

On top of the MTCVD TiCN layer was a 1-2 μm thick bonding layer deposited at 1000° C. by a process consisting of two separate reaction steps. First a HTCVD TiCN step using TiCl$_4$, CH$_4$, N$_2$, and H$_2$ at 55 mbar, then a second step using TiCl$_4$, CO and H$_2$ at 55 mbar and thereby producing a bonding layer. Prior to the start of the α-Al$_2$O$_3$ nucleation, the bonding layer was oxidized for 2 minutes in a mixture of CO$_2$, HCl and H$_2$.

Thereafter an α-Al$_2$O$_3$ layer was deposited at 1000° C. and 55 mbar in three steps. The first step using 2.3 vol-% AlCl$_3$, 4.6 vol-% CO2, 1.7 vol-% HCl and balance H$_2$ giving about 0.1 μm α-Al$_2$O$_3$ and a second step using 2.2% AlCl$_3$, 4.4% CO$_2$, 5.5% HCl, 0.33% H$_2$S and balance H$_2$ and thereafter a third step using 2.2% AlCl$_3$, 8.8% CO$_2$, 5.5% HCl, 0.55% H$_2$S and balance H$_2$ giving a total α-Al$_2$O$_3$ layer thickness of about 5 μm.

The coating also comprises an outermost layer of about 1 μm thick TiN.

Sample 3 (Reference)

Cemented carbide substrates of ISO-type CNMG120408 for turning were manufactured with a composition of 7.2 wt-% Co, 2.7 wt % Ta, 1.8 wt % Ti, 0.4 wt % Nb, 0.1 wt % N and balance WC. The substrates comprise a Co enriched surface zone of about 25 μm from the substrate surface and to a depth into the body being essentially free from cubic carbides.

The substrates were first coated with a thin approximately 0.4 μm TiN-layer then with an approximately 7 μm TiCN layer by employing the well-known MTCVD technique using TiCl$_4$, CH$_3$CN, N$_2$, HCl and H$_2$ at 885° C. The volume ratio of TiCl$_4$/CH$_3$CN in an initial part of the MTCVD deposition of the TiCN layer was 3.7, followed by a period using a ratio of TiCl$_4$/CH$_3$CN of 2.2.

On top of the MTCVD TiCN layer was a 1-2 μm thick bonding layer deposited at 1000° C. by a process consisting of four separate reaction steps. First a HTCVD TiCN step using TiCl$_4$, CH$_4$, N$_2$, HCl and H$_2$ at 400 mbar, then a second step (TiCNO-1) using TiCl$_4$, CH$_3$CN, CO, N$_2$, HCl and H$_2$ at 70 mbar, then a third step (TiCNO-2) using TiCl$_4$, CH$_3$CN, CO, N$_2$ and H$_2$ at 70 mbar and finally a fourth step (TiCNO-3) using TiCl$_4$, CO, N$_2$ and H$_2$ at 70 mbar. Prior to the start of the subsequent Al$_2$O$_3$ nucleation, the bonding layer was oxidized for 4 minutes in a mixture of CO$_2$, CO, N$_2$ and H2.

Thereafter an α-Al$_2$O$_3$ layer was deposited at 1000° C. and 55 mbar in two steps. The first step using 1.2 vol-% Al$_2$O$_3$, 4.7 vol-% CO$_2$, 1.8 vol-% HCl and balance H$_2$ giving about 0.1 μm α-A$_2$O$_3$ and a second step using 1.2% Al$_3$, 4.7% CO$_2$, 2.9% HCl, 0.58% H$_2$S and balance H$_2$ giving a total α-Al$_2$O$_3$ layer thickness of about 5 μm.

The coating also comprises an outermost layer of about 1 μm thick TiN.

The layer thicknesses were analyzed in a light optical microscope by studying a cross section of each coating at 1000× magnification and both the bonding layer and the initial TiN layer are included in the TiCN layer thickness given in Table 1.

TABLE 1

| Sample | TiCN thickness (μm) | Al$_2$O$_3$ thickness (μm) | TiN thickness (μm) |
|---|---|---|---|
| Sample 1 | 9.3 | 4.0 | — |
| Sample 2 | 8.5 | 4.5 | 1 |
| Sample 3 | 9.0 | 5.0 | 1 |

The texture coefficients were studied with the XRD method as disclosed above. The results are presented in Table 2.

TABLE 2

| Sample | TC(1 0 4) | TC(1 1 0) | TC(1 1 3) | TC(0 2 4) | TC(1 1 6) | TC(2 1 4) | TC(3 0 0) | TC(0 0 12) |
|---|---|---|---|---|---|---|---|---|
| Sample 1 | 0.13 | 0.79 | 0.17 | 1.87 | 0.2 | 0.17 | 0 | 4.67 |
| Sample 2 | 1.49 | 0.61 | 0.35 | 0.8 | 2.06 | 0.38 | 2.31 | 0 |
| Sample 3 | 0.42 | 0.13 | 0.06 | 0.15 | 0.26 | 0.1 | 0.04 | 6.85 |

The widths of the columnar α-Al$_2$O$_3$-grains were studied and the average width for Sample 1 was about 1 μm.

Pole figures were measured by EBSD in a portion of the α-Al$_2$O$_3$ layer parallel to the outer surface of the coating.

Figure 6:
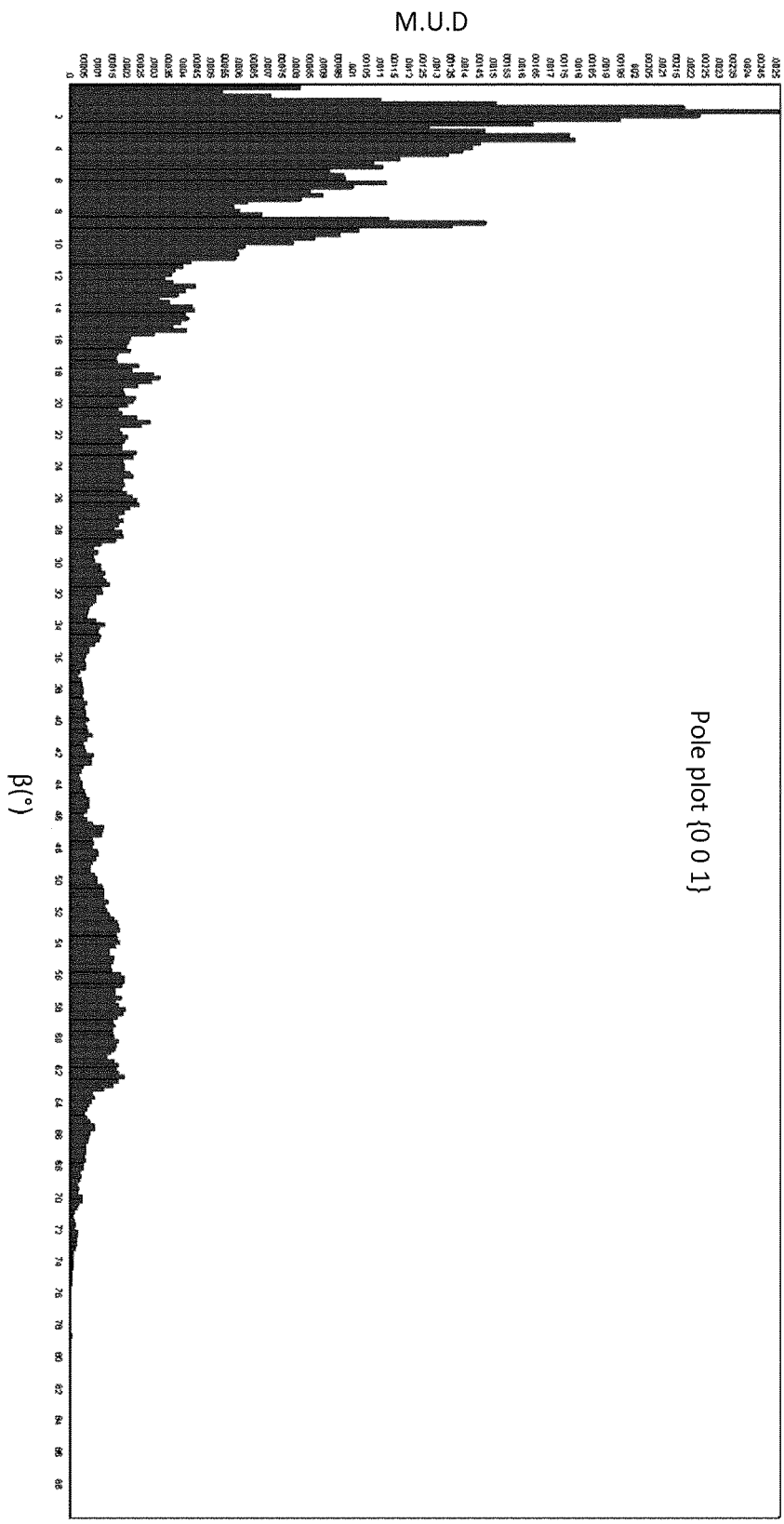
FIG. 6. Pole plot of {0 0 1} from EBSD pole figure data of Sample 1 with a bin size of 0.25 over a tilt angle range of 0°≤β≤90°. The x-label indicates the angle β and ranges from 0° to 90°. The y-label indicates intensity and is indicated M.U.D.
Figure 7:
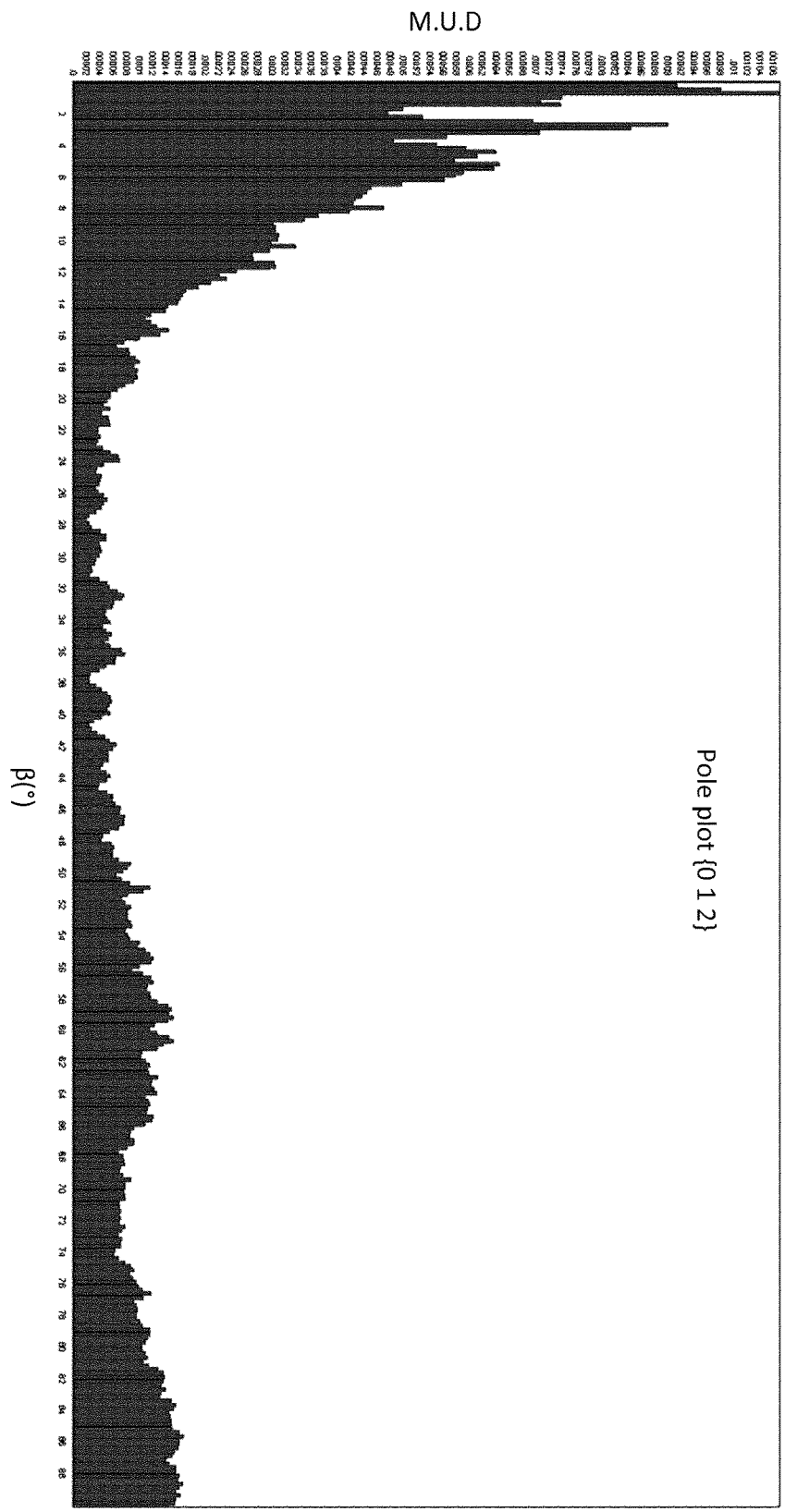
FIG. 7. Pole plot of {0 1 2} from EBSD pole figure data of Sample 1 with a bin size of 0.25 over a tilt angle range of 0°≤β≤90°. The x-label indicates the angle β and ranges from 0° to 90°. The y-label indicates intensity and is indicated M.U.D.

Crystallographic orientation data extraction of the acquired EBSD data was made using Oxford Instruments "HKL Tango" software version 5.12.60.0 (64-bit) and Oxford Instruments "HKL Mambo" software version 5.12.60.0 (64-bit). Pole figures using equal area projection and upper hemisphere projection were retrieved from the acquired EBSD data using the "HKL Mambo" software. The retrieved pole figures were for both the {0 0 1} and {0 1 2} poles with the Z direction being perpendicular to the outer surface of the coatings. Pole figures for both the {0 0 1} and the {0 1 2} pole were generated from the same EBSD data and thereby from data originating from the same portion of the α-Al$_2$O$_3$ layer. Pole plots of both the {0 0 1} and {0 1 2} pole figures were extracted using a class width of 0.25° for the bin size in the pole plot and for an angular measuring range β from β=0° to β≤90°. The intensity in the pole plot ranging from β=0 to β≤15° was related to the total intensity in the pole plot ranging from β=0° to β≤90°. The pole plots of {0 0 1} and {0 1 2} of Sample 1 are shown in FIG. 6 and FIG. 7, respectively. The relative intensity for 0°-15° in the measurement 0°-90° was in the pole plot {0 0 1} was about 66% and the relative intensity for 0°-15° in the measurement 0°-90° was in the pole plot {0 1 2} about 52%.

Prior to cutting wear tests the inserts were blasted on the rake faces in a wet blasting equipment using a slurry of alumina in water and the angle between the rake face of the cutting insert and the direction of the blaster slurry was about 90°. The alumina grits were F220, the pressure of slurry to the gun was 1.8 bar, the pressure of air to the gun was 2.2 bar, the average time for blasting per area unit was 4.4 seconds and the distance from the gun nozzle to the surface of the insert was about 145 mm. The aim of the blasting is to influence the residual stress in the coating and the surface roughness and thereby improve the properties of the inserts in the subsequent turning test.

Example 2

Crater Wear Test

The coated cutting tools, i.e. Samples 1, 2 and 3 were tested in longitudinal turning in ball bearing steel (Ovako 825B) using the following cutting data;

Cutting speed $v_c$: 220 m/min
Cutting feed, f: 0.3 mm/revolution
Depth of cut, $a_p$: 2 mm
Insert style: CNMG120408-PM
Water miscible metal working fluid was used.
One cutting edge per cutting tool was evaluated.

In analyzing the crater wear, the area of exposed substrate was measured, using a light optical microscope. When the surface area of the exposed substrate exceeded 0.2 mm² the life time of the tool was considered to be reached. The wear of each cutting tool was evaluated after 2 minutes cutting in the light optical microscope. The cutting process was then continued with a measurement after each 2 minutes run, until the tool life criterion was reached. When the size of the crater area exceeded 0.2 mm² the time until the tool life criterion was met was estimated based on an assumed constant wear rate between the two last measurements. Beside crater wear, flank wear was also observed, but did not in this test influence the tool life. The average results of two parallel tests are shown in Table 3.

TABLE 3

|  | Sample | | |
|---|---|---|---|
|  | Sample 1 | Sample 2 | Sample 3 |
| Life time (min) | 30 | 17 | 32 |

Example 3

Plastic Deformation Depression Test

The coated cutting tools, i.e. Samples 1, 2 and 3, were tested in a test aimed to evaluate the resistance against flaking at plastic deformation of the cutting edge.

The work piece material consisted of low-alloyed steel (SS2541-03). Longitudinal turning of this work piece was performed and evaluated at two different cutting speeds.

The following cutting data was used;
Cutting speed $v_c$: 105 or 115 m/min
Depth of cut $a_p$: 2 mm
Feed f: 0.7 mm/rev
Time in cut: 0.5 min
No metal working fluid was used.

Two cutting edges were tested in parallel tests for each cutting speed. The cutting was performed during 0.5 minutes and the cutting edge was then evaluated in a light optical microscope. The flaking due to plastic deformation of the cutting edge was classified as follows: 0=no flaking, 1=minor flaking, 2=large flaking. The flaking was also classified regarding the depth of the flaking such that AC=flaking of the alumina layer, GAC=flaking down to the substrate. In table 4 the AC/GAC values are given for each tested cutting edge.

TABLE 4

| Sample | 105 m/min | 115 m/min |
|---|---|---|
| Sample 1 | 0/0 | 2/2 |
|  | 0/0 | 0/0 |
| Sample 2 | 1/0 | 2/2 |
|  | 1/1 | 0/0 |
| Sample 3 | 2/0 | 2/1 |
|  | 2/0 | 2/2 |

Example 4

Thermal Intermittence Test

The coated cutting tools, i.e. Samples 1, 2 and 3, were tested in a test aimed to evaluate the resistance against thermal cracks and edge line chipping.

The work piece material consisted of steel (SS1672), a "balk" with a square cross section. Longitudinal turning of this work piece was performed and evaluated. The pre-determined number of 10 cycles was run and thereafter each cutting edge was evaluated in a light optical microscope. Three parallel tests were performed and the average is presented in Table 5.

The following cutting data was used;
Cutting speed $v_c$: 220 m/min
Depth of cut $a_p$: 3 mm
Feed f: 0.3 mm/rev
Length of cut: 19 mm
No metal working fluid was used.

TABLE 5

|  | Sample | | |
|---|---|---|---|
|  | Sample 1 | Sample 2 | Sample 3 |
| Edge line chipping | Minor chipping | Major chipping | Minor chipping |

From the cutting tests it can be concluded that the Sample 1 shows improved wear performance in the combination of high resistance against flaking at plastic deformation of the cutting edge and high resistance against both crater wear at the rake face and resistance against thermal cracks and edge line chipping. In the cutting tests of Example 2 and 4, Sample 1 (invention) and Sample 3 (reference) outperforms Sample 2 (reference), while in the cutting test of Example 3, Sample 1 and Sample 2 outperforms Sample 3.

While the invention has been described in connection with the above exemplary embodiments, it is to be understood that the invention is not to be limited to the disclosed exemplary embodiments; on the contrary, it is intended to cover various modifications and equivalent arrangements within the appended claims.

The invention claimed is:
1. A coated cutting tool comprising:
a substrate; and
a coating, wherein the coating includes at least one layer of $\alpha$-$Al_2O_3$ with a thickness of 1-20 μm deposited by chemical vapour deposition (CVD), wherein said $\alpha$-$Al_2O_3$ layer exhibits an X-ray diffraction pattern, wherein a texture coefficient TC(h k l) is defined according to Harris formula

$$TC(hkl) = \frac{I(hkl)}{I0(hkl)} \left[ \frac{1}{n} \sum_{i=0}^{n} \frac{I(hkl)}{I0(hkl)} \right]^{-1}$$

wherein the (h k l) reflections used are (1 0 4), (1 1 0), (1 1 3), (0 2 4), (1 1 6), (2 1 4), (300) and (0 0 12),
I(h k l)=measured intensity of the (h k l) reflection,
$I_0$(h k l)=standard intensity according to ICDD's PDF-card No. 00-10-0173,
n=8,
wherein 1<TC(0 2 4)<4 and 3<TC(0 0 12)<6, and wherein the sum of the TC(0 0 12) and TC(0 2 4) for said $\alpha\text{-Al}_2\text{O}_3$ layer is >6.5.

2. The coated cutting tool of claim 1, wherein said $\alpha\text{-Al}_2\text{O}_3$ layer exhibits 1<TC(0 2 4)<3 and 3.5<TC(0 0 12)<5.5.

3. The coated cutting tool of claim 1, wherein said $\alpha\text{-Al}_2\text{O}_3$ layer exhibits 1.5<TC(0 2 4)<2.5 and 4<TC(0 0 12)<5.

4. The coated cutting tool of claim 1, wherein the third strongest TC(h k l) of said $\alpha\text{-Al}_2\text{O}_3$ layer is TC(1 1 0).

5. The coated cutting tool of claim 1, wherein said $\alpha\text{-Al}_2\text{O}_3$ layer exhibits a {0 0 1} pole figure as measured by EBSD in a portion of the $\alpha\text{-Al}_2\text{O}_3$ layer parallel to the outer surface of the coating, wherein a pole plot based on the data of the pole figure, with a bin size of 0.25° over a tilt angle range of 0°≤β≤90° from a normal of an outer surface of the coating has a ratio of intensity within β<15° tilt angle to the intensity within 0°≤β≤90° of ≥40%, and wherein said $\alpha\text{-Al}_2\text{O}_3$ layer exhibits a {0 1 2} pole figure as measured by EBSD in a portion of the $\alpha\text{-Al}_2\text{O}_3$ layer parallel to the outer surface of the coating, wherein a pole plot based on the data of the pole figure, with a bin size of 0.25° over a tilt angle range of 0°≤β≤90° from the normal of the outer surface of the coating shows a ratio of intensity within β<15° tilt angle to the intensity within 0°<β<90° of >40%.

6. The coated cutting tool of claim 5, wherein the {0 0 1} pole figure and the {0 1 2} pole figure are from a same portion of the $\alpha\text{-Al}_2\text{O}_3$ layer.

7. The coated cutting tool of claim 1, wherein said $\alpha\text{-Al}_2\text{O}_3$ layer includes columnar grains.

8. The coated cutting tool of claim 1, wherein the $\alpha\text{-Al}_2\text{O}_3$ layer includes columnar $\alpha\text{-Al}_2\text{O}_3$ layer grains and wherein an average width of said columnar grains is 0.5-2 μm as measured along a line parallel to a surface of the substrate in the middle of said $\alpha\text{-Al}_2\text{O}_3$ layer.

9. The coated cutting tool of claim 1, wherein the thickness of the $\alpha\text{-Al}_2\text{O}_3$ layer is 2-10 μm.

10. The coated cutting tool of claim 1, wherein the coating further includes a layer of one or more of TiN, TiCN, TiC, TiCO, TiCNO.

11. The coated cutting tool of claim 1, wherein the coating includes layers in the following order from the surface of the substrate: TiN, TiCN, TiCNO and $\alpha\text{-Al}_2\text{O}_3$.

12. The coated cutting tool of claim 1, wherein the coating includes an outermost wear indication color layer.

13. The coated cutting tool of claim 1, wherein the substrate is cemented carbide with a surface zone extending from the substrate surface to a depth of about 15-35 μm into the body, said surface zone being binder phase enriched and essentially free from cubic carbides.

14. The coated cutting tool of claim 1, wherein the substrate is cemented carbide with a Co content of 6-12 wt %.

15. The coated cutting tool of claim 1, wherein the cutting tool is a cutting insert and where an inscribed circle of said cutting insert has a diameter of ≥15 mm.

* * * * *